United States Patent
Horikiri et al.

(10) Patent No.: US 12,054,847 B2
(45) Date of Patent: Aug. 6, 2024

(54) METHOD AND DEVICE FOR MANUFACTURING STRUCTURE

(71) Applicant: SUMITOMO CHEMICAL COMPANY, LIMITED, Tokyo (JP)

(72) Inventors: Fumimasa Horikiri, Hitachi (JP); Noboru Fukuhara, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 317 days.

(21) Appl. No.: 17/640,003

(22) PCT Filed: Jul. 6, 2020

(86) PCT No.: PCT/JP2020/026456
§ 371 (c)(1),
(2) Date: Apr. 27, 2022

(87) PCT Pub. No.: WO2021/044724
PCT Pub. Date: Mar. 11, 2021

(65) Prior Publication Data
US 2022/0325431 A1 Oct. 13, 2022

(30) Foreign Application Priority Data
Sep. 5, 2019 (JP) .................. 2019-162205

(51) Int. Cl.
C25F 3/12 (2006.01)
C25F 7/00 (2006.01)
H01L 21/3063 (2006.01)

(52) U.S. Cl.
CPC .................. *C25F 3/12* (2013.01); *C25F 7/00* (2013.01); *H01L 21/30635* (2013.01)

(58) Field of Classification Search
CPC ...... C25F 3/12; C25F 3/30; C25F 7/00; H01L 21/30612; H01L 21/30635
See application file for complete search history.

(56) References Cited

U.S. PATENT DOCUMENTS

2004/0209194 A1 10/2004 Kume et al.
2006/0154391 A1 7/2006 Tran et al.
(Continued)

FOREIGN PATENT DOCUMENTS

JP 2004-289032 A 10/2004
JP 2005-136002 A 5/2005
(Continued)

OTHER PUBLICATIONS

Bardwell et al., "Ultraviolet photoenhanced wet etching of GaN in K2S2O8 solution" Journal of Applied Physics, vol. 89(7), pp. 4142-4149 (Year: 2001).*

(Continued)

*Primary Examiner* — Nicholas A Smith
(74) *Attorney, Agent, or Firm* — Foley & Lardner LLP

(57) ABSTRACT

A method for manufacturing a structure, including photo-electrochemically etching an etching object, the photoelectrochemical etching of the etching object including: injecting an alkaline or acidic etching solution containing an oxidizing agent that receives electrons, into a rotatably held container in which an etching object at least whose surface is composed of group III nitride is held, and immersing the surface in the etching solution; irradiating the surface of the etching object held in the container with light in a stationary state of the etching object and the etching solution; and rotating the container to scatter the etching solution toward an outer peripheral side, thereby discharging the etching solution from the container, after the surface is irradiated with the light.

20 Claims, 9 Drawing Sheets

(56) References Cited

U.S. PATENT DOCUMENTS

| | | | |
|---|---|---|---|
| 2012/0244649 A1* | 9/2012 | Sano | B24B 37/0053 |
| | | | 438/692 |
| 2013/0105331 A1* | 5/2013 | Zhan | H01L 21/30612 |
| | | | 204/239 |
| 2015/0068680 A1 | 3/2015 | Sano et al. | |
| 2018/0112325 A1 | 4/2018 | Ishii et al. | |

FOREIGN PATENT DOCUMENTS

| | | |
|---|---|---|
| JP | 2007-201014 A | 8/2007 |
| JP | 2007-305748 A | 11/2007 |
| JP | 2008-527717 A | 7/2008 |
| JP | 2011-146695 A | 7/2011 |
| JP | 2015-170609 A | 9/2015 |
| JP | 2018-067689 A | 4/2018 |

OTHER PUBLICATIONS

Van Dorp et al., "Photoetching Mechanisms of GaN in Alkaline $S_2O_8^{2-}$—Solution" 2009 J. Electrochem. Soc. 156 D371 (Year: 2009).*

Horikiri et al., "Simple wet-etching technology for GaN using an electrodeless photo-assisted electrochemical reaction with a luminous array film as the UV source" 2019 Appl. Phys. Express 12 031003 (Year: 2019).*

Toguchi et al., "Electrodeless photo-assisted electrochemical etching of GaN using a H3PO4-based solution containing $S_2O_8^{2-}$-ions", 2019 Appl. Phys. Express 12 066504 (Year: 2019).*

International Preliminary Report on Patentability issued in corresponding International Patent Application No. PCT/JP2020/026456 dated Mar. 17, 2022.

Murata et al., "Photo-electrochemical etching of free-standing GaN wafer surfaces grown by hydride vapor phase epitaxy", Electrochimica Acta, vol. 171, 2015, pp. 89-95.

Samukawa, Seiji, "Ultimate Top-down Etching Processes for Future Nanoscale Devices: Advanced Neutral-Beam Etching," Japanese Journal of Applied Physics, vol. 45, No. 4A, 2006, pp. 2395-2407.

Faraz et al., "Atomic Layer Etching: What Can We Learn from Atomic Layer Deposition?" ECS J Journal of Solid State Science and Technology, vol. 4, No. 6, 2015, pp. N5023-5032.

International Searching Authority, "International Search Report," issued in connection with International Patent Application No. PCT/JP2020/026456, dated Jul. 28, 2020.

International Searching Authority, "Written Opinion," issued in connection with International Patent Application No. PCT/JP2020/026456, dated Jul. 28, 2020.

* cited by examiner

METHOD AND DEVICE FOR MANUFACTURING STRUCTURE

CROSS-REFERENCE TO RELATED APPLICATIONS

The present application claims priority under 37 U.S.C. § 371 to International Patent Application No. PCT/JP2020/026456, filed Jul. 6, 2020, which claims priority to and the benefit of Japanese Patent Application No. 2019-162205, filed on Sep. 5, 2019. The contents of these applications are hereby incorporated by reference in their entireties.

TECHNICAL FIELD

The present disclosure relates to a method for manufacturing a structure and a manufacturing device for a structure.

DESCRIPTION OF RELATED ART

Group III nitride such as gallium nitride (GaN) is used as a material for manufacturing semiconductor devices such as light emitting devices and transistors. Further, the group III nitrides are also attracting attention as materials for a microelectromechanical system (MEMS).

Photoelectrochemical (PEC) etching has been proposed as an etching technique for forming various structures on group III nitrides such as GaN (see, for example, Non-Patent Document 1). The PEC etching is preferable because it is a type of wet etching that causes less damage compared to ordinary dry etching and also because a device used in the etching is simpler compared to special dry etching that causes less damage, such as neutral-beam etching (see, for example, Non-Patent Document 2) and atomic layer etching (see, for example, Non-Patent Document 3).

PRIOR ART DOCUMENT

Non-Patent Document

[Non-Patent Document 1] J. Murata et al., "Photo-electrochemical etching of free-standing GaN wafer surfaces grown by hydride vapor phase epitaxy", Electrochimica Acta 171 (2015) 89-95

[Non-Patent Document 2] S. Samukawa, JJAP, 45(2006) 2395.

[Non-Patent Document 3] T. Faraz, ECS J. Solid Stat. Scie. & Technol., 4, N5023 (2015).

SUMMARY OF THE DISCLOSURE

Problems to be Solved by the Disclosure

An object of the present disclosure is to provide a technology to enable smooth manufacturing of a structure using a group III nitride by PEC etching.

Means for Solving the Problem

According to an aspect of the present disclosure, there is provided a method for manufacturing a structure, including photoelectrochemically etching an etching object, the photoelectrochemical etching of the etching object including:

injecting an alkaline or acidic etching solution containing an oxidizing agent that receives electrons, into a rotatably held container in which an etching object at least whose surface is composed of group III nitride is held, and immersing the surface in the etching solution;

irradiating the surface of the etching object held in the container with light in a stationary state of the etching object and the etching solution; and rotating the container to scatter the etching solution toward an outer peripheral side, thereby discharging the etching solution from the container, after the surface is irradiated with the light.

According to another aspect of the present disclosure, there is provided a manufacturing device for a structure, including:

a rotatably held container in which an etching object at least whose surface is composed of group III nitride is held;

an injection device that injects an alkaline or acidic etching solution into the container, the alkaline or acidic etching solution containing an oxidizing agent that receives electrons;

a light irradiation device that irradiates the surface of the etching object held in the container with light;

a rotation device that rotatably holds the container;

a control device that controls the injection device, the light irradiation device, and the rotation device to perform a photoelectrochemical etching process to the etching object, the photoelectrochemical etching process to the etching object including:

a process for injecting the etching solution into the container in which the etching object is held, and immersing the surface in the etching solution, a process for irradiating the surface of the etching object held in the container with light in a stationary state of the etching object and the etching solution, and a process for rotating the container to scatter the etching solution toward an outer peripheral side, thereby discharging the etching solution from the container, after the surface is irradiated with the light.

Advantage of the Disclosure

Provided is a technology to enable smooth manufacturing of a structure using a group III nitride by the PEC etching.

DETAILED DESCRIPTION OF THE DISCLOSURE

First Embodiment

The following is a description of a method for manufacturing a structure according to a first embodiment of the present disclosure. The method for manufacturing the structure according to this embodiment includes performing photoelectrochemical (PEC) etching (hereinafter also referred to as PEC etching step) of the etching object 10 (hereinafter also referred to as wafer 10).

The structure is a member including the wafer 10 subjected to the PEC etching by the PEC etching step (hereinafter also referred to as a wafer 10 after processing), that is, may be a member including the wafer 10 after processing provided with other member such as an electrode as needed (such as a semiconductor device, a microelectromechanical system (MEMS)), or may be the wafer 10 after processing itself.

Figure 1A:
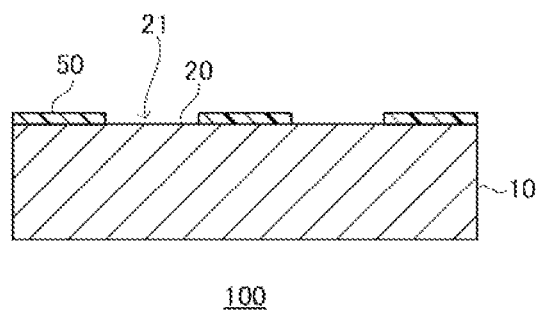
FIG. 1(a) is a schematic cross-sectional view illustrating a wafer (processing object)

FIG. 1(a) is a schematic cross-sectional view illustrating the wafer 10. The wafer 10 is a member at least whose surface 20 to be subjected to the PEC etching is composed of group III nitride. The wafer 10 may be a group III nitride substrate such as a gallium nitride (GaN) substrate, or, for example, it may be an epitaxial substrate in which a group III nitride layer is epitaxially grown on a growth substrate. The growth substrate of the epitaxial substrate may be a heterogenous substrate such as a sapphire substrate, a silicon carbide (SiC) substrate, a silicon (Si) substrate, or the like, or, for example, it may be the homogenous substrate such as a GaN substrate. Further, the growth substrate of the epitaxial substrate may be, for example, semi-insulating, or may be, for example, conductive. Here, "semi-insulating" means, for example, a state where a specific resistance is $10^5$ Ωcm or more. In contrast, for example, a state where the specific resistance is less than $10^5$ Ωcm is called "conductive".

Although there are no particular limitations on the size of the wafer 10, for example, the wafer 10 preferably has a large diameter such as 2 inches or more from a viewpoint of improving the productivity by forming a large number of elements in a single wafer at the same time. The size of the wafer 10 is, for example, 2 inches (50.8 mm) in diameter, 4 inches (101.6 mm) in diameter, or 6 inches (152.4 mm) in diameter.

The surface 20 is composed of a c-plane of group III nitride crystal, for example. Here, the phrase "composed of the c-plane" means that a lowest index crystal plane closest to the surface 20 is the c-plane of the group III nitride crystal constituting the surface 20. The group III nitride constituting the surface 20 has dislocations (through dislocations), and the dislocations are distributed at a predetermined density in the surface 20.

An object 100 to be processed by the PEC etching (hereinafter, also referred to as processing object 100) has a wafer 10, and if necessary, has a mask 50 or the like provided on the wafer 10. The mask 50 defines a region 21 to be etched which is to be subjected to the PEC etching, on the surface 20. The mask 50 may be made of a conductive material such as titanium (Ti), or, for example, it may be made of a non-conductive material such as resist or silicon oxide. The processing object 100 may be the wafer 10 itself without the mask 50, and the region 21 to be etched may be an entirety of the surface 20 of the wafer 10.

Figure 2:
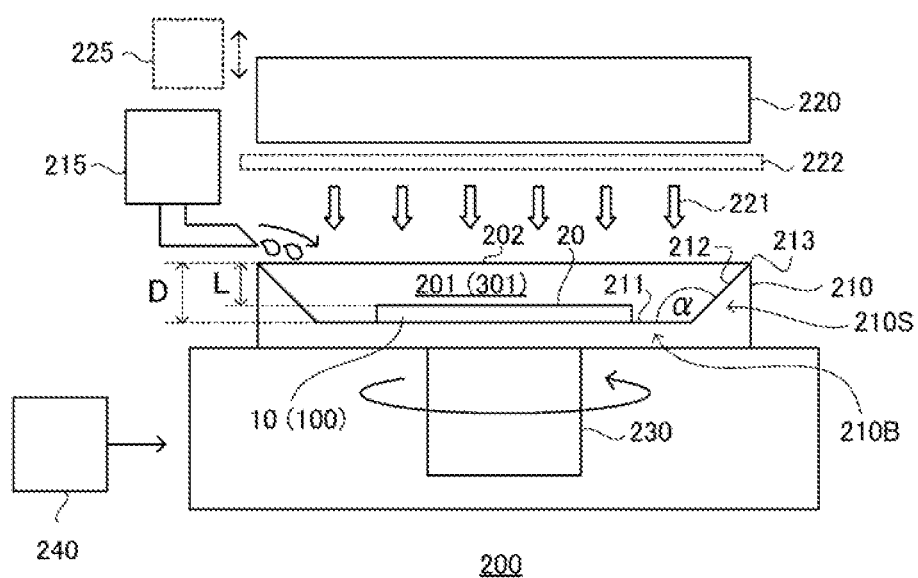
FIG. 2 is a schematic cross-sectional view illustrating an example of a processing device.

FIG. 2 is a schematic cross-sectional view illustrating an example of the manufacturing device for the structure (processing device for wafer 10) 200 (hereinafter also referred to as processing device 200) which is used in a method for manufacturing a structure according to this embodiment. The processing device 200 includes a container 210, the injection device 215, the light irradiation device 220, the rotation device 230, and the control device 240.

The container 210 is rotatably held, and holds the wafer 10 (processing object 100) and contains the etching solution 201. The injection device 215 injects the etching solution 201 into the container 210. The light irradiation device 220 irradiates the surface 20 of the wafer 10 held in the container 210 with ultraviolet (UV) light 221. The rotation device 230 holds the container 210 rotatably, and rotates the container 210 at a predetermined speed. Note that, holding the container 210 in a stationary state may be included in "rotating at a predetermined speed" by regarding the rotation speed as zero. The control device 240 controls each of the injection device 215, the light irradiation device 220, and the rotation device 230 so that a predetermined operation is performed. The control device 240 is configured using, for example, a personal computer.

Figure 3A:
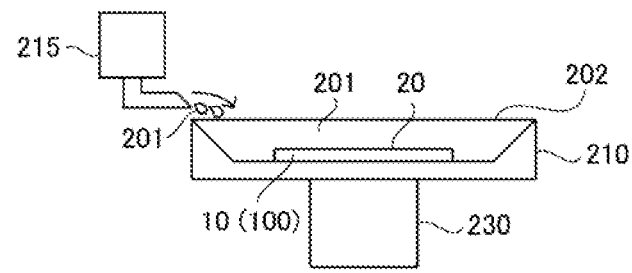
FIG. 3(a) to FIG. 3(c) are schematic cross-sectional views illustrating a PEC etching step in a first embodiment of the present disclosure.
Figure 3B:
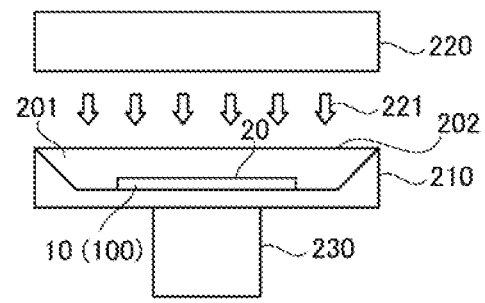
Figure 3C:
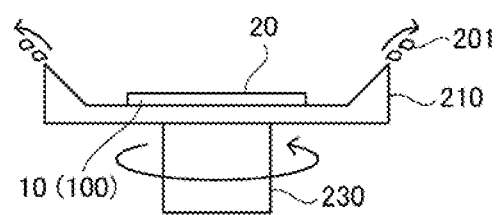

FIG. 3(a) to FIG. 3(c) are schematic cross-sectional views illustrating a PEC etching step in this embodiment. With reference to FIG. 3(a) to FIG. 3(c), the PEC etching step will be described, and a structure and an operation of a processing device 200 will be described in more detail.

The PEC etching step includes: injecting the etching solution 201 into the container 210 in which the wafer 10 is held, and immersing the surface 20 in the etching solution 201 (hereinafter also referred to as injection-immersion step); irradiating the surface 20 of the wafer 10 held in the container 210 with UV light 221 in a stationary state of the wafer 10 and the etching solution 201 (hereinafter also referred to as light irradiation step); and rotating the container 210 to scatter the etching solution 201 toward an outer peripheral side, thereby discharging the etching solution 201 from the container 210, after the surface 20 is irradiated with UV light 221 (hereinafter also referred to as discharge step).

FIG. 3(a) is a schematic cross-sectional view illustrating the injection-immersion step. The container 210 holds the wafer 10 in such a way that the surface 20 is arranged horizontally, that is, in such a way that the surface 20 of the wafer 10 is parallel to a surface 202 of the etching solution 201. As a holding mechanism for the wafer 10, a pin mechanism is used, for example, or a vacuum chuck mechanism is used, for example.

A bottom of a container 210 corresponding to a wafer 10 having a diameter of 2 inches (50.8 mm) has a diameter of 70 mm, for example. A bottom of a container 210 corresponding to a wafer 10 having a diameter of 4 inches (101.6 mm) has a diameter of 120 mm, for example. A bottom of a container 210 corresponding to a wafer 10 having a diameter of 6 inches (152.4 mm) has a diameter of 170 mm, for example.

The etching solution 201 is injected into the container 210 from the injection device 215, and the surface 20 of the wafer 10 is immersed in the etching solution 201. The injection of the etching solution 201 is preferably performed in a stationary state of the container 210 without driving the rotation device 230. After the etching solution 201 is injected, the etching solution 201 is left until it stands still.

As described below, in the light irradiation step, a distance L from the surface 20 of the wafer 10 to the surface 202 of the etching solution 201 (hereinafter also referred to as wafer placement depth L; see, FIG. 2) is preferably 1 mm or more and 10 mm or less. Therefore, the injection device 215 injects the etching solution 201 so that the wafer placement depth L is 1 mm or more and 10 mm or less.

From a viewpoint of easily obtaining an appropriate wafer placement depth L, the container 210 is preferably configured so that the wafer placement depth L is 1 mm or more and 10 mm or less in a state where the container 210 is filled up to a height of a brim 213 with the etching solution 201 (see, FIG. 2). For example, in a case where a thickness of the wafer 10 is 0.5 mm and a target wafer placement depth L is 5 mm, the wafer placement depth L can be 5 mm by setting a depth D of the container 210 to 5.5 mm and filling the container 210 up to the height of the brim 213 with the etching solution 201, the depth D being a height of the container 210 from the bottom 211 to the brim 213. In this way, the appropriate wafer placement depth L can be easily obtained. Alternatively, the appropriate wafer placement depth L may be obtained by appropriately adjusting the height of the surface 202 of the etching solution 201 depending on the injection device 215.

FIG. 3(b) is a schematic cross-sectional view illustrating the light irradiation step. In the light irradiation step, the container 210 is stopped by preventing the rotation device 230 from being rotationally driven, and the surface 20 of the wafer 10 is irradiated with UV light 221 in a stationary state of the wafer 10 and the etching solution 201. In the region 21 to be etched, which is in contact with the etching solution 201 and is irradiated with UV light 221, the group III nitride is etched by the PEC etching.

As will be described in detail below, irradiation with UV light 221 generates sulfate ion radicals ($SO_4^{-*}$ radicals) from peroxodisulfate ions ($S_2O_8^{2-}$) contained in the etching solution 201 in this embodiment.

In the light irradiation step, the wafer 10 and the etching solution 201 are preferably in a stationary state. Being in such a state suppresses the variation in a supply state of $SO_4^{-*}$ radicals to the surface 20, the variation resulting from the movement of the etching solution 201, and allows $SO_4^{-*}$ radicals to be supplied to the surface 20 by diffusion, so that the PEC etching can be performed uniformly in the plane.

In this embodiment, the container 210 is held by the rotation device 215, which enables switching between a stationary operation of the container 210 in the light irradiation step and a rotation operation of the container 210 in the discharge step described below.

In the light irradiation step, the surface 20 of the wafer 10 is preferably parallel to the surface 202 of the etching solution 201. Such a state allows a thickness of the etching solution 201 (i.e., wafer placement depth L) placed above the surface 20 to be uniform, which in turn enables uniform generation of $SO_4^{-*}$ radicals in the etching solution 201 placed above the surface 20 and uniform supply of $SO_4^{-*}$ radicals to the surface 20 due to diffusion. Therefore, the PEC etching can be performed uniformly in the plane.

A state where the surface 20 of the wafer 10 is "parallel" to the surface 202 of the etching solution 201 means that an angle between the surface 20 of the wafer 10 and the surface 202 of the etching solution 201 is within a range of 0°±2°.

In the light irradiation step, the wafer placement depth L is preferably 1 mm or more and 10 mm or less, for example. When the wafer placement depth L is excessively short, for example, less than 1 mm, an amount of $SO_4^{-*}$ radicals generated in the etching solution 201 above the surface 20 may become unstable due to a fluctuation in the wafer placement depth L. When the wafer placement depth L is short, it becomes difficult to control a height of the liquid surface. Therefore, the wafer placement depth L is preferably 1 mm or more, more preferably 3 mm or more, and further preferably 5 mm or more. Further, when the wafer placement depth L is excessively long, for example, more than 10 mm, a large amount of $SO_4^{-*}$ radicals that do not contribute to the PEC etching are unnecessarily generated in the etching solution 201 above the surface 20, and therefore utilization efficiency of the etching solution 201 is reduced.

In the light irradiation step, UV light 221 is preferably irradiated perpendicularly to an entirety of the surface 20 of the wafer 10 (to each of the regions 21 to be etched defined on the surface 20). That is, the light irradiation device 220 is preferably configured to irradiate UV light 221 perpendicularly to the entirety of the surface 20 of the wafer 10. Accordingly, the irradiation conditions of the UV light 221 in the surface 20 can be equalized, so that the PEC etching can be performed uniformly in the plane.

Here, "perpendicularly" to the surface 20 means that an angle formed by UV light 221 and the surface 20 is within a range of 90°±2°. It is more preferable that the UV light 221 be a parallel light with all beams perpendicularly aligned, but it is acceptable the UV light 221 is not parallel (the UV light may be convergent light or diffused light). "Perpendicularly irradiated" means that the intensity of the perpendicularly irradiated component is the highest in the UV light 221 irradiated to each region 21 to be etched defined on the surface 20.

One light irradiation step is referred to as one cycle. A light irradiation time per cycle for the UV light 221 may be appropriately set according to an etching depth to be etched by the PEC etching in one cycle.

FIG. 3(c) is a schematic cross-sectional view illustrating the discharge step. After the light irradiation step, the container 210 is rotated to scatter the etching solution 201 toward an outer peripheral side, thereby discharging the etching solution 201 from the container 210, For example, a rotation condition of rotating at 1000 rpm for 20 seconds is exemplified. The rotation conditions may be adjusted as appropriate so that the etching solution 201 is discharged from the container 210.

The container 210 is configured so that a mode of containing the etching solution 201 (or a post-processing solution 301 described later) and a mode of discharging the etching solution can be switched depending on a state of rotation. From a viewpoint of facilitating the scattering of the etching solution 201 toward the outer peripheral side due to the rotation of the container 210, an inner surface 212 (see, FIG. 2) of the container 210 is preferably composed of a surface whose upper side is inclined toward the outer peripheral side. With such a configuration, it is possible to suppress inhibition of the movement of the etching solution 201 toward the outer peripheral side due to the centrifugal force, and it is also possible to suppress the etching solution 201 from consequently remaining in the container 210, as compared to a case where the inner surface 212 is composed of a surface whose upper side is inclined inwardly. Accordingly, the etching solution 201 can be facilitated to be discharged from the container 210.

The inner surface 212 of the container 210 being "a surface whose upper side is inclined toward an outer peripheral side" means that an angle α formed by a bottom 211 and the inner surface 212 (hereinafter also referred to as simply angle α) is more than 90° and 180° or less in the container 210. The angle α may vary depending on the position (depending on the height) in the inner surface 212. In other words, the inner surface 212 of the container 210 can be a surface with varying degrees of inclination depending on its position (depending on its height), or it can be a curved surface.

From a viewpoint of facilitating the movement of the etching solution 201 toward the outer peripheral side in the discharge step, the angle α is preferably 120° or more, for example. On the other hand, the larger the angle α, the wider the width in the radial direction occupied by a side surface member 210S that constitutes the inner surface 212 of the container 210. Therefore, from a viewpoint of not excessively widening the width of the side surface member 210S, the angle α is preferably 150° or less, for example. An example of a shape of the inner surface 212 is a shape in which the α is constant, for example, 135°, at any position (at any height). The angle α may be appropriately set according to the difference between the diameter of the bottom 211 at a position of the bottom 211 of the inner surface 212 and the diameter of an opening at the height of the brim 213 of the inner surface 212.

The side surface member 210S (see, FIG. 2) of the container 210 may, for example, be integrally configured with the bottom member 210B constituting the bottom 211 of the container 210, or may, for example, be attached to the bottom member 210B as a separate member from the bottom member 210B.

Figure 4A:
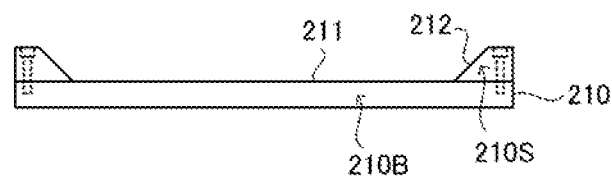
FIG. 4(a) and FIG. 4(b) are schematic cross-sectional views illustrating various structures of the container in the processing device.

FIG. 4(a) is a schematic cross-sectional view illustrating the container 210 having a structure in which the side surface member 210S is attached to the bottom member 210B. The bottom member 210B is a flat plate-like member, and the side surface member 210S is an annular member. The side surface member 210S constitutes a structure protruding like a bank in a state of being attached to the bottom member 210B. The side surface member 210S in this example has a portion having a flat upper surface, which is located on the outer peripheral side of the inner surface 212, and is attached to the bottom member 210B by screwing the portion.

Figure 4B:
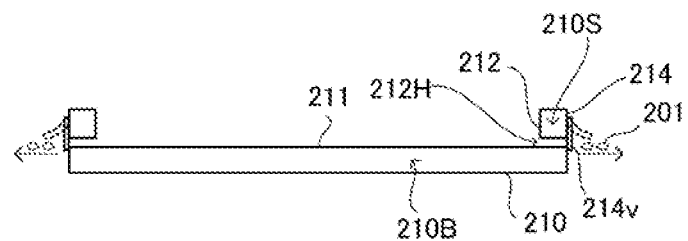

Another structure may be used as a structure that facilitates scattering of the etching solution 201 toward the outer peripheral side due to the rotation of the container 210. An example of such another structure is a structure in which the container 201 is configured so that the shape of the side surface part of the container 201 is changed to facilitate the scattering of the etching solution 201 toward the outer peripheral side when the discharge step is performed, as compared to when the light irradiation step is performed. FIG. 4(b) is a schematic cross-sectional view illustrating the container 201 having such a structure. In the side surface member 210S of the container 201, a hole 212H is formed at a lower part of the inner surface 212 to communicate the inner surface 212 to the outer surface 214. The holes 212H are arranged at discrete positions along the circumferential direction of the container 201, for example, at positions axisymmetric about the rotation axis. A valve member 214v is provided on the outer surface 214 of the container 201 to close each hole 212H when the container 201 is in a stationary state. The valve member 214v can be configured in any way, for example, it can be made of rubber material. When the container 201 is rotated, the valve member 214v is pushed open by centrifugal force, so that the etching solution 201 contained in the container 201 is discharged to the outer peripheral side through the hole 212H (valve member 214v during rotation is indicated by broken lines).

After the etching solution 201 is discharged from the container 210, the rotation of the container 210 is stopped to terminate the discharge step. As described above, the PEC etching step, including the injection-immersion step, the light irradiation step, and the discharge step, is performed (once). The PEC etching step may be performed once or a plurality of times depending on the relationship between the etching depth to be etched in one cycle of the light irradiation step and the etching depth to be finally achieved (hereinafter also referred to as target etching depth).

When the PEC etching step is performed a plurality of times, the injection-immersion step, the light irradiation step, and the discharge step are performed a plurality of times in that order. That is, in the PEC etching step in a certain cycle, the injection-immersion step, the light irradiation step, and the discharge step are performed, and after the discharge step in that cycle is terminated, the injection-immersion step in the next cycle is started, and the injection-immersion step, the light irradiation step, and the discharge step in the next cycle are performed.

Figure 6A:
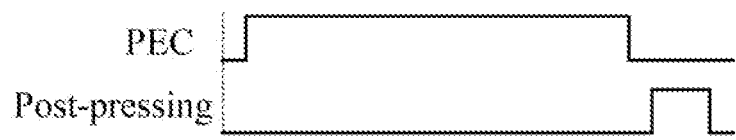
FIG. 6(a) to FIG. 6(d) are timing charts conceptionally illustrating several combination aspects of performing the PEC etching step and the post-processing step.
Figure 6:
Figure 6:
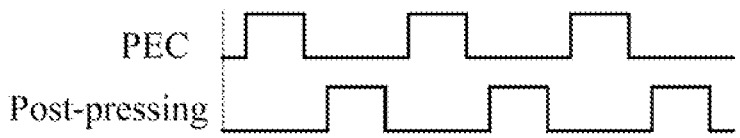
Figure 6:
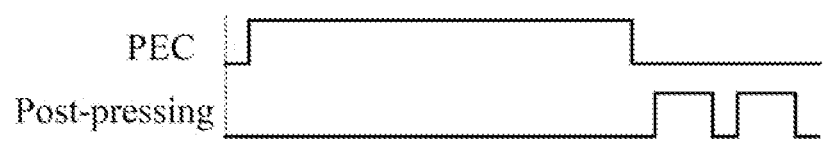

In a case of performing the PEC etching step (only) once (see, the upper row of FIG. 6(a)), one cycle of the light irradiation step is performed to etch to the target etching depth. In a case of performing PEC etching steps a plurality of times, that is, in a case of performing step control of the PEC etching (see the upper row of FIG. 6(b) or the upper row of FIG. 6(c)), each cycle of the light irradiation step etches a partial depth of the entirety of the target etching depth, and multiple cycles of the light irradiation step are performed to etch to the target etching depth.

For example, the target etching depth is 20 nm, and the etching rate of the PEC etching is 0.5 nm/min. For example, when the light irradiation time per cycle is set to 40 minutes, the PEC etching step is performed (only) once to etch to the target etching depth. Alternatively, for example, when the light irradiation time per cycle is set to 10 minutes, the PEC etching step is performed four times to etch to the target etching depth. Alternatively, for example, when the light irradiation time per cycle is set to 1 minute, the PEC etching step is performed forty times to etch to the target etching depth.

Performing the PEC etching step a plurality of times, that is, performing step control of the PEC etching has the following advantages, for example. The etching depth of the PEC etching can be controlled by an etching time, but an error in the etching depth tends to increase as the etching time increases. Therefore, when the PEC etching is performed once to etch to the target etching depth, the error of the etching depth tends to increase. In contrast, with the step control, the etching time for each cycle is reduced, and the etching depth is gradually deepened, which makes it easier to fine-tune the overall etching depth and to keep the error in the target etching depth small.

Further, the step control makes it easier to suppress the time-dependent change in the etching condition. As will be described in detail below, the etching conditions change, for example, the pH of the etching solution 201 changes, as the PEC etching progresses. With the step control, since the etching solution 201 is replaced in each cycle of the PEC etching step, the PEC etching can be performed with a new etching solution 201. Therefore, the PEC etching can be performed in a state where the time-dependent change in the etching conditions is suppressed, as compared to when the PEC etching is performed once to etch to the target etching depth, that is, as compared to when the PEC etching is performed without replacing the etching solution 201.

After the wafer 10 (wafer 10 after processing) subjected to the PEC etching is obtained by performing the PEC etching step once or a plurality of times as described above, other steps (electrode forming step, etc.) are performed according to a configuration of the structure to be obtained (semiconductor device, MEMS, etc.). In this way, the structure is produced. Some processing (formation of members, formation of structure, etc.) may be performed on the wafer 10 before the PEC etching step of this embodiment is performed, as needed. That is, the processing object 100 for the PEC etching may have already been subjected to such processing.

Next, a mechanism of the PEC etching and the like will be described in more detail. GaN will be described as an example of the Group III nitride to be etched.

An alkaline or acidic etching solution 201 which contains oxygen used to generate oxides of group III elements contained in the group III nitride constituting the surface 20 of the wafer 10, and further contains an oxidizing agent receiving electrons is used as the etching solution 201 for the PEC etching.

As the oxidizing agent, peroxodisulfate ion ($S_2O_8^{2-}$) is exemplified. Hereinafter, an embodiment of supplying $S_2O_8^{2-}$ from potassium peroxydisulfate ($K_2S_2O_8$) will be exemplified. However, $S_2O_8^{2-}$ may be supplied from others, for example, from sodium peroxodisulfate ($Na_2S_2O_8$), ammonium peroxodisulfate (ammonium persulfate, $(NH_4)_2S_2O_8$), or the like.

A first example of the etching solution 201 includes those in which potassium hydroxide (KOH) aqueous solution and potassium peroxydisulfate ($K_2S_2O_8$) aqueous solution are mixed and which exhibit alkaline character at the start of the PEC etching. Such an etching solution 201 is prepared, for example, by mixing 0.01 M KOH aqueous solution and 0.05 M $K_2S_2O_8$ aqueous solution at a ratio of 1:1. The concentration of the KOH aqueous solution, the concentration of the $K_2S_2O_8$ aqueous solution, and the mixing ratio of these aqueous solutions may be appropriately adjusted, as necessary. The etching solution 201 in which the KOH aqueous solution and the $K_2S_2O_8$ aqueous solution are mixed can be made acidic at the start of the PEC etching, for example, by lowering the concentration of the KOH aqueous solution.

A PEC etching mechanism using the etching solution 201 of the first example will be described. By irradiating the region 21 to be etched with UV light 221 having a wavelength of 365 nm or less, holes and electrons are generated in pairs in the GaN constituting the region 21 to be etched. The generated holes decompose GaN into $Ga^{3+}$ and $N_2$ (Chemical formula 1), and further, $Ga^{3+}$ is oxidized by hydroxide ions ($OH^-$) to generate gallium oxide ($Ga_2O_3$) (Chemical formula 2). Then, the generated $Ga_2O_3$ is dissolved in an alkali (or acid). In this way, the PEC etching of GaN is performed. The generated holes react with water and the water is decomposed to generate oxygen (Chemical formula 3).

$GaN(s)+3h^+ \rightarrow Ga^+ + 1/2N_2(g)\uparrow$ [Chemical Formula 1]

$Ga^{3+}+3OH^- \rightarrow 1/2Ga_2O_3(s)+3/2H_2O(l)$ [Chemical Formula 2]

$H_2O(l)+2h^+ \rightarrow 1/2O_2(g)\uparrow +2H^+$ [Chemical Formula 3]

Further, dissolution of $K_2S_2O_8$ in water produces peroxodisulfate ion ($S_2O_8^{2-}$) (Chemical formula 4), and irradiation of $S_2O_8^{2-}$ with UV light 221 produces sulfate ion radicals ($SO_4^{-*}$ radicals) (Chemical formula 5). The electrons generated in pairs with the holes react with water together with $SO_4^{-*}$ radicals, and the water is decomposed to generate hydrogen (Chemical formula 6). In this way, in the PEC etching of this embodiment, by using $SO_4^{-*}$ radicals, it is possible to consume the electrons generated in pairs with the holes in the GaN, and therefore the PEC etching can progress. That is, it is possible to perform electrodeless PEC etching, which is a type of the PEC etching without using a cathode immersed in the etching solution 201 in a state of being connected to a wiring extending outside of the etching solution 201. As illustrated in (Chemical formula 6), as the sulfate ion ($SO_4^{2-}$) increases with a progress of the PEC etching, the acidity of the etching solution 201 becomes stronger (pH decreases).

$K_2S_2O_8 \rightarrow 2K^+ + S_2O_8^{2-}$ [Chemical Formula 4]

$S_2O_8^{2-} + \text{heat or } hv \rightarrow 2SO_4^{-*}$ [Chemical Formula 5]

$2SO_4^{-*}+2e^-+2H_2O(l) \rightarrow 2SO_4^{2-}+2HO^*+H_2(g)\uparrow$ [Chemical Formula 6]

A second example of the etching solution 201 includes phosphoric acid ($H_3PO_4$) aqueous solution and potassium peroxydisulfate ($K_2S_2O_8$) aqueous solution which are mixed, and exhibits acidic character at the start of the PEC etching. Such an etching solution 201 is prepared, for example, by mixing a 0.01 M $H_3PO_4$ aqueous solution and a 0.05 M $K_2S_2O_8$ aqueous solution at a ratio of 1:1. The concentration of the $H_3PO_4$ aqueous solution, the concentration of the $K_2S_2O_8$ aqueous solution, and the mixing ratio of these aqueous solutions may be appropriately adjusted, as necessary. Since both the $H_3PO_4$ aqueous solution and the $K_2S_2O_8$ aqueous solution are acidic, the etching solution 201 in which the $H_3PO_4$ aqueous solution and the $K_2S_2O_8$ aqueous solution are mixed, is acidic at an arbitrary mixing ratio. Since the $K_2S_2O_8$ aqueous solution itself exhibits acidic character, only the $K_2S_2O_8$ aqueous solution may be used as the etching solution 201 which is acidic at the start of the etching. In this case, the concentration of the $K_2S_2O_8$ aqueous solution may be, for example, 0.025 M.

It is preferable that the etching solution 201 is acidic from the start of the PEC etching from a viewpoint of facilitating the use of a resist as the mask 50. This is because the resist mask is easily peeled off when the etching solution 201 is alkaline. When Ti or silicon oxide is used as the mask 50 (or when the mask 50 is not used), there is no particular problem whether the etching solution 201 is acidic or alkaline.

A PEC etching mechanism in a case of using the etching solution 201 of the second example is presumed as the mechanism described for the case of using the etching solution 201 of the first example in which (chemical formula 1) to (chemical formula 3) are replaced with (chemical formula 7). That is, $Ga_2O_3$, hydrogen ions ($H^+$), and $N_2$ are generated by a reaction of GaN, holes generated by irradiation with UV light 221, and water (Chemical formula 7). Then, the generated $Ga_2O_3$ is dissolved in the acid. In this way, the PEC etching of GaN is performed. The mechanism by which the electrons generated in pairs with the holes are consumed by $S_2O_8^{2-}$ as illustrated in (Chemical formula 4) to (Chemical formula 6) is similar to that in the case of using the etching solution 201 of the first example.

$GaN(s)+3h^+ +3/2H_2O(l) \rightarrow 1/2Ga_2O_3(s)+3H^+ +1/2N_2(g)\uparrow$ [Chemical Formula 7]

As illustrated in (chemical formula 5), as a technique of generating $SO_4^{-*}$ radicals from $S_2O_8^{2-}$, at least one of the irradiation with UV light 221 and heating can be used. In a case of using the irradiation with UV light 221, in order to increase a light absorption by $S_2O_8^{2-}$ and efficiently generate $SO_4^{-*}$ radicals, it is preferable that a wavelength of the UV light 221 is 200 nm or more and less than 310 nm. That is, from a viewpoint of efficiently generating holes in the group III nitride in the wafer 10 and generating $SO_4^{-*}$ radicals from $S_2O_8^{2-}$ in the etching solution 201 by irradiation with UV light 221, the wavelength of the UV light 221 is preferably 200 nm or more and less than 310 nm. When the generation of $SO_4^{-*}$ radicals from $S_2O_8^{2-}$ is performed by heating, the wavelength of the UV light 221 may be 310 nm or more (and 365 nm or less).

When generating $SO_4^{-*}$ radicals from $S_2O_8^{2-}$ by irradiation with UV light 221, it is preferred that the wafer placement depth L is, for example, 1 mm or more and 10 mm or less, as described above.

The PEC etching can also be performed to the group III nitrides other than the exemplified GaN. The group III element contained in the group III nitride may be at least one of aluminum (Al), gallium (Ga) and indium (In). The concept of the PEC etching for the Al component or In component in the group III nitride is similar to the concept described for the Ga component with reference to (Chemical formula 1) and (Chemical formula 2), or (Chemical formula 7). That is, holes are formed by irradiation with light 221 to generate an oxide of Al or an oxide of In, and these oxides are dissolved in an alkali or an acid, thereby performing the PEC etching. The wavelength of the light 221 may be appropriately changed depending on the composition of the group III nitride to be etched. When Al is contained, light having a shorter wavelength may be used, and when In is contained, light having a longer wavelength can also be used, with the PEC etching of GaN as a reference. That is, light having a wavelength such that the group III nitride is subjected to the PEC etching can be appropriately selected and used depending on the composition of the group III nitride to be processed.

Figure 1B:
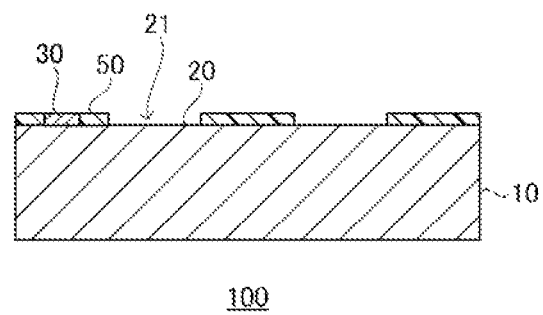
FIG. 1(b) is a schematic cross-sectional view illustrating a processing object provided with a cathode pad.

In a case of using the mask 50 made of a non-conductive material, with the epitaxial substrate having a semi-insulating substrate as the wafer 10, a cathode pad 30 as described below may be used to promote the PEC etching. FIG. 1(b) is a schematic cross-sectional view illustrating the processing object 100, provided with the cathode pad 30. The cathode pad 30 is a conductive member made of a conductive material, and is provided so as to be in contact with at least a part of the surface of the conductive region of the wafer 10 which is electrically connected to the region 21 to be etched. The cathode pad 30 is provided so that at least a part, for example, an upper surface, of the cathode pad 30 comes into contact with the etching solution 201 at the time of the PEC etching.

As understood from (Chemical formula 1) and (Chemical formula 2), or (Chemical formula 7), the region 21 to be etched where the PEC etching occurs, is considered to function as an anode where the holes are consumed. Further, as understood from (Chemical formula 6), it is considered that in the cathode pad 30 which is a conductive member electrically connected to the region 21 to be etched, the surface in contact with the etching solution 201 functions as a cathode where electrons are consumed (released). Therefore, the cathode pad 30 may be used to promote the PEC etching.

Second Embodiment

A method for manufacturing a structure according to a second embodiment will be described. In the second embodiment, an aspect will be exemplified which includes a step of post-processing (hereinafter also referred to as post-processing step) the wafer 10 (processing object 100) after the PEC etching step described in the first embodiment. The PEC etching step is similar to that described in the first embodiment.

The post-processing step of this embodiment is performed using the processing device 200 described in the first embodiment (see, FIG. 2). The container 210 holds the wafer 10 and contains the post-processing solution 301 as well. The injection device 215 injects the post-processing solution 301 into the container 210. Productivity can be improved by performing the PEC etching step and the post-processing step using the same processing device 200.

The post-processing step includes injecting the post-processing solution 301 into the container 210 in which the wafer 10 is held, the wafer being subjected to the PEC etching by the PEC etching step, and maintaining a state where the wafer 10 is immersed in the post-processing solution 301 for a predetermined period of time (hereinafter also referred to as injection-immersion step), and rotating the container 210 to scatter the post-processing solution 301 toward the outer peripheral side, thereby discharging the post-processing solution 301 from the container 210 (hereinafter also referred to as discharge step).

As the post-processing, for example, washing is performed, or, for example, the flattening etching is performed. The details of the flattening etching will be discussed later. When the washing is performed as the post-processing, a washing solution such as pure water is used as the post-processing solution 301. When the flattening etching is performed as the post-processing, a flattening etching solution described later is used as the post-processing solution 301.

Figure 5A:
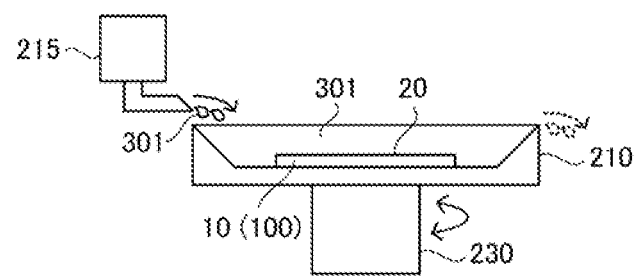
FIG. 5(a) and FIG. 5(b) are schematic cross-sectional views illustrating a post-processing step in a second embodiment.
Figure 5B:
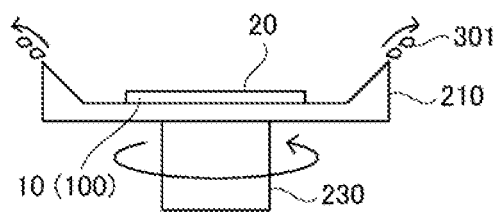

FIG. 5(a) and FIG. 5(b) are schematic cross-sectional views illustrating the post-processing step in this embodiment. FIG. 5(a) is a schematic cross-sectional view illustrating the injection-immersion step. The post-processing solution 301 is injected into the container 210 from the injection device 215, and a state where the wafer 10 is immersed in the post-processing solution 301 is maintained for a predetermined period of time. Since the wafer 10 is immersed in the post-processing solution 301, the post-processing according to the type of post-processing solution 301 proceeds on the wafer 10. The predetermined period for maintaining the state where the wafer 10 is immersed in the post-processing solution 301 may be appropriately set according to the post-processing to be performed.

During a period in which the post-processing solution 301 is injected or during a period in which the wafer 10 is immersed in the post-processing solution 301, the container 210 may be in a stationary state without rotationally driving the rotation device 230, or the container 210 may be in a rotating state with rotationally driving the rotation device 230, as needed. The container 210 may be rotated at a speed such that the state where the wafer 10 is immersed in the post-processing solution 301 is maintained (so that the post-processing solution 301 is not excessively discharged). The direction of rotation of the container 210 may be unidirectional or may be reversed. The reversal of the direction of rotation (reversal of the direction of swing) may be repeated.

For example, when the washing or the flattening etching is performed as the post-processing, the container 210 may be rotated to generate flow of the post-processing solution 301 (relative to the wafer 10) in order to improve the efficiency of the washing or the flattening etching.

During the period in which the wafer 10 is immersed in the post-processing solution 301, the injection of the post-processing solution 301 may be stopped or continued intermittently or continuously, as needed. When the injection of the post-processing solution 301 is continued, an amount of the post-processing solution 301 the container 210 cannot contain may overflow the container 210 and therefore may be discharged from the container 210.

For example, when the washing or the flattening etching is performed as the post-processing, the injection of the post-processing solution 301 may be continued to keep the post-processing solution 301 fresh in the container 210 during the period in which the wafer 10 is immersed in the post-processing solution 301, thereby improving the efficiency of the washing or the flattening etching.

FIG. 5(b) is a schematic cross-sectional view illustrating the discharge step. After the injection-immersion step, the container 210 is rotated to scatter the post-processing solution 301 toward an outer peripheral side, thereby discharging the post-processing solution 301 from the container 210. For example, a rotation condition of rotating at 1000 rpm for 20 seconds is exemplified. The rotation conditions may be adjusted as appropriate so that the post-processing solution 301 is discharged from the container 210.

After the post-processing solution 301 is discharged from the container 210, the rotation of the container 210 is stopped to terminate the discharge step. As described above, the post-processing step, including the injection-immersion step and the discharge step, is performed (once). The post-processing step may be performed once or a plurality of times as needed.

When the post-processing step is performed a plurality of times, the injection-immersion step and the discharge step are performed a plurality of times in that order. That is, in the post-processing step in a certain cycle, the injection-immersion step and the discharge step are performed, and after the discharge step in that cycle is terminated, the injection-immersion step in the next cycle is started, and the injection-immersion step and the discharge step in the next cycle are performed.

The PEC etching step and the post-processing step may be performed in combination as appropriate. FIG. 6(a) to FIG. 6(d) are timing charts conceptionally illustrating several combination aspects of performing the PEC etching step and the post-processing step.

FIG. 6(a) illustrates an embodiment in which the post-processing step is performed once after the PEC etching step is performed once, that is, after the PEC etching is performed once to etch to the target etching depth.

FIG. 6(b) illustrates an embodiment in which the post-processing step is performed once after the PEC etching step is performed a plurality of times, that is, after the PEC etching with step control is performed to etch to the target etching depth.

FIG. 6(c) illustrates an embodiment in which the PEC etching step and the post-processing step are repeated alternately, when the PEC etching step is performed a plurality of times, that is, when the PEC etching with step control is performed.

The type of the post-processing performed in each post-processing step may be appropriately selected as needed. As illustrated in FIG. 6(d), the same or different types of post-processing steps may be performed a plurality of times continuously (without interrupted by the PEC etching step). For example, after the flattening etching step is performed as a first post-processing step, the washing step may be performed as a second post-processing step.

Next, the flattening etching will be described. First, as a first example of the flattening etching, an embodiment will be exemplified, in which the flattening etching step is performed once as the post-processing step, after the PEC etching step is performed once, that is, after the PEC etching is performed once to etch to the target etching depth (see, FIG. 6(a)).

Figure 7A:
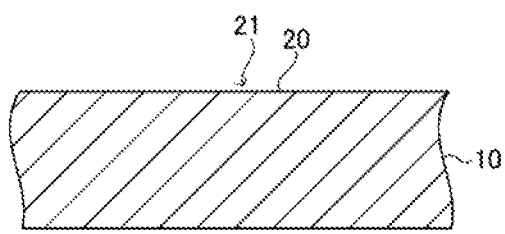
FIG. 7(a) to FIG. 7(c) are schematic cross-sectional views of the wafer, collectively illustrating the PEC etching step and a flattening etching step in a first example of the flattening etching.
Figure 7B:
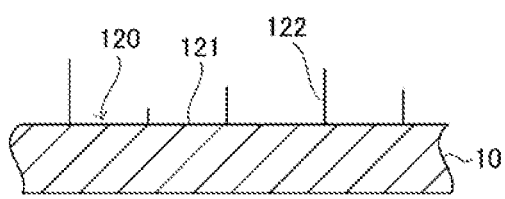
Figure 7C:
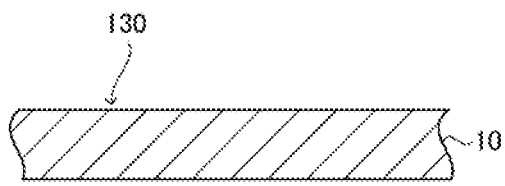

FIG. 7(a) to FIG. 7(c) are schematic cross-sectional views of the wafer 10, collectively illustrating the PEC etching step and the flattening etching step in the first example. FIG. 7(a) illustrates the wafer 10 before the start of the PEC etching step.

FIG. 7(b) illustrates the wafer 10 after the end of the PEC etching step and before the start of the flattening etching step (hereinafter also referred to as wafer 10 after PEC processing). A surface 120 (hereinafter, also referred to as surface 120 after PEC processing), which is a surface 20 subjected to the PEC etching, is formed on the wafer 10 after PEC processing.

As described above, dislocations are distributed at a predetermined density on the surface 20 of the wafer 10. In the dislocations, a hole lifetime is short, so the PEC etching is unlikely to occur. Therefore, a protruding portion 122 is likely to be formed as an undissolved portion after the PEC etching at a position corresponding to the dislocation on the surface 120 after PEC processing. That is, in the PEC etching step, a flat portion 121 and a protruding portion 122 are formed on the surface 120 after PEC processing, the flat portion being (a portion where the PEC etching has progressed without dislocation) newly appeared by the PEC etching, and the protruding portion being raised with respect to the flat portion 121 and generated by being less likely to be etched than the flat portion 121. Since the protruding portion 122 is the undissolved portion after the PEC etching, its height is at most an etching depth or less of the PEC etching.

FIG. 7(c) illustrates the wafer 10 after the end of the flattening etching step (hereinafter also referred to as wafer 10 after flattening processing). On the wafer 10 after flattening processing is formed a surface 130 which is the surface 120 after PEC processing subjected to the flattening etching (hereinafter also referred to as surface 130 after flattening processing).

In the flattening etching, the protruding portion 122 formed on the surface 120 after PEC processing is lowered by etching the protruding portion 122 (selectively with respect to the flat portion 121). The "flattening" means that the flatness of the surface 130 after flattening processing is improved as compared to that of the surface 120 after PEC processing, by lowering the protruding portion 122.

As the flattening etching, for example, wet etching (not PEC etching) using an acidic or alkaline etching solution is used. As an etching solution for the flattening etching, for example, hydrochloric acid (HCl) aqueous solution, mixed aqueous solution of hydrochloric acid (HCl) and hydrogen peroxide ($H_2O_2$) (hydrochloric acid hydrogen peroxide), mixed aqueous solution of sulfuric acid ($H_2SO_4$) and hydrogen peroxide ($H_2O_2$) (piranha solution), tetramethylammonium hydroxide (TMAH) aqueous solution, hydrogen fluoride aqueous solution (hydrofluoric acid), potassium hydroxide (KOH) aqueous solution, etc., may be used. More specifically, the flattening etching is performed for 10 minutes using hydrochloric acid hydrogen peroxide, for example, a mixture of 30% HCl and 30% $H_2O_2$ at a ratio of 1:1.

The flattening etching is not the PEC etching. Therefore, in the flattening etching step, the wafer 10 is not irradiated with UV light. Here, "not irradiated with UV light" means to prevent irradiation of (strong) UV light that causes unnecessary PEC etching.

It is known that it is difficult to etch the c-plane of the group III nitride such as GaN. However, the PEC etching can etch the group III nitride regardless of a crystal orientation, and therefore the PEC etching can etch even the c-plane. The PEC etching in the PEC etching step etches the group III nitride constituting the surface 20 from a direction perpendicular to the surface 20 (that is, in a thickness direction of the wafer 10) by irradiation with UV light 221 from above the surface 20 of the wafer 10 which is the c-plane.

In contrast, the flattening etching is performed as normal wet etching, which is not the PEC etching, using, for example, an etching solution such as hydrochloric acid hydrogen peroxide. In the normal wet etching, it is difficult to etch the c-plane of the group III nitride, and therefore the flat portion 121 composed of the c-plane on the surface 120 after PEC processing, is not etched. However, since the protruding portion 122 includes a crystal plane other than the c-plane, it can be etched by the normal etching. Accordingly, by the flattening etching, the protruding portion 122 can be selectively etched with respect to the flat portion 121. The flattening etching is to etch a crystal plane other than the c-plane, that is, a crystal plane intersecting the c-plane, so that the protruding portion 122 is etched from a direction that is not perpendicular to the c-plane (that is, in a direction that intersects the thickness direction of the wafer 10 (lateral direction)).

By lowering the protruding portion 122 by the flattening etching, the protruding portion 122 can be brought closer to the c-plane constituting the flat portion 121. When the protruding portion 122 is etched and brought closer to the c-plane, the etching becomes difficult to progress. Therefore, in the flattening etching step of this embodiment, it is easy to terminate the flattening etching in a state where the protruding portion 122 is suppressed from being excessively etched and the surface 130 after flattening processing is substantially flat.

In the group III nitride layer heteroepitaxially grown on a heterogenous substrate, the protruding portion 122 associated with the PEC etching step is likely to be formed due to higher dislocation density than in the group III nitride layer homoepitaxially grown on the homogenous substrate or in the group III nitride substrate. Therefore, in a case where the PEC etching step is performed to the wafer 10 having the group III nitride layer heteroepitaxially grown on the heterogenous substrate, it is more preferable to perform the flattening etching step as the post-processing step.

Next, as a second example of the flattening etching, an embodiment will be exemplified, in which the PEC etching step and the flattening etching step as the post-processing step are repeated alternately, when the PEC etching step is performed a plurality of times, that is, when the PEC etching with step control is performed (see, FIG. 6(c)).

Figure 8A:
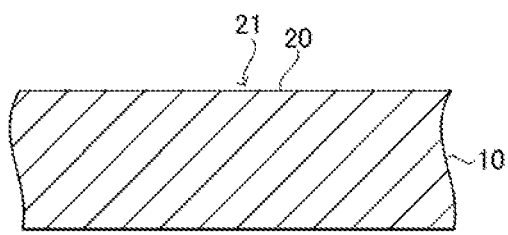
FIG. 8(a) to FIG. 8(e) are schematic cross-sectional views of the wafer, collectively illustrating the PEC etching step and the flattening etching step in a second example of the flattening etching.
Figure 8B:
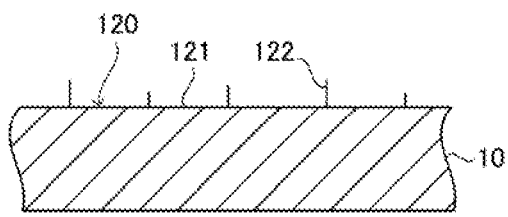
Figure 8C:
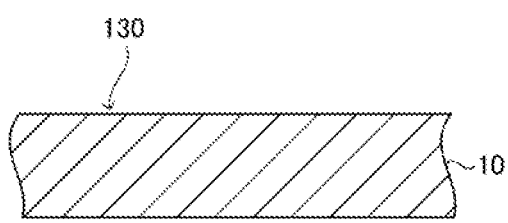
Figure 8D:
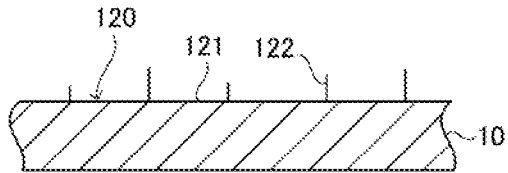
Figure 8E:
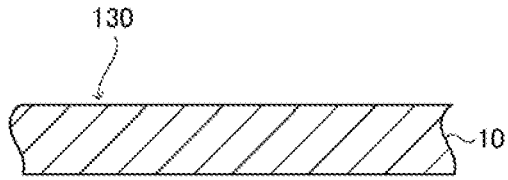

FIG. 8(a) to FIG. 8(e) are schematic cross-sectional views of the wafer 10, collectively illustrating the PEC etching step and the flattening etching step in the second example. FIG. 8(a) illustrates the wafer 10 before the start of the first PEC etching step. FIG. 8(b) illustrates the wafer 10 after the end of the first PEC etching step. FIG. 8(c) illustrates the wafer 10 after the end of the first flattening etching step. FIG. 8(d) illustrates the wafer 10 after the end of the second PEC etching step. FIG. 8(e) illustrates the wafer 10 after the end of the second flattening etching step.

In the second example, the depth to be etched by one PEC etching step is shallower, compared to the first example. Therefore, in the second example (see FIG. 8(b) and FIG. 8(d)), the formed protruding portions 122 are generally lower and the difference in height between the protruding portions 122 is smaller, as compared to those in the first example (see FIG. 7(b)).

Accordingly, in the flattening etching step (in each cycle) of the second example, it becomes easy to etch the protruding portion 122, and it becomes easy to make the height of the protruding portion 122 after etching uniform. Then, by repeating the flattening etching step a plurality of times, the protruding portion 122 can be etched more reliably. Therefore, in the second example, the flatness of a finally obtained surface 130 after flattening processing can be further improved.

In this embodiment, after the wafer 10 subjected to the PEC etching and the post-processing is obtained by the PEC etching step and the post-processing step, other steps (electrode forming step, etc.) are performed according to a configuration of the structure (semiconductor device, MEMS, etc.) to be obtained. In this way, the structure is produced.

As described in the first and second embodiments, the manufacture of the structure using the group III nitride can be smoothly performed by performing the PEC etching step in a state where the container 210 is held so as to rotate at a predetermined timing and a predetermined speed, that is, in a state where the rotation speed of the container 210 is appropriately adjusted depending on the timing, and performing the post-processing step as needed.

For example, in the PEC etching step, in-plane uniformity of the PEC etching can be improved by keeping the container 210 in a stationary state during the light irradiation step, and the etching solution 201 can be easily discharged from the container 210 by rotating the container 210 during the discharge step.

For example, in the post-processing step, the efficiency of the post-processing can be improved by rotating the container 210 to an extent that the wafer 10 is kept immersed in the post-processing solution 301 during the injection-immersion step, and the post-processing solution 301 can be easily discharged from the container 210 by rotating the container 210 during the discharge step.

At the end of the PEC etching step or the post-processing step, discharge of the etching solution 201 or the post-processing solution 301 from the container 210 has been completed. Accordingly, the wafer 10 can be easily removed from the container 210. Alternatively, for example, when the PEC etching step or the post-processing step is subsequently performed, that is, when the steps are repeated, the etching solution 201 or the post-processing solution 301 can be easily injected at the start of the next step.

By completely scattering the etching solution 201 or the post-processing solution 301 in a short time by high speed rotation, no droplets can be left on the wafer 10 at the end of the PEC etching step or the post-processing step. Accordingly, occurrence of uneven etching, uneven drying such as water spots can be suppressed.

In order to perform these steps smoothly, the container 210 is configured so that a mode of containing the etching solution 201 or the post-processing solution 301 and a mode of discharging the etching solution 201 or the post-processing solution 301 can be switched depending on the state of rotation.

Other Embodiments

Explanations have been given specifically for the embodiments of the present disclosure. However, the present disclosure is not limited to the above-described embodiment, and various changes, improvements, combinations, and the like can be made without departing from the gist thereof.

The processing device 200 may be provided with various members, mechanisms, and the like other than those described above, as needed. For example, a lid-like member 222 (for example, a plate transparent to light 221) may be provided to prevent the scattered etching solution 201 or the like from adhering to the light irradiation device 220 at the time of discharging the etching solution 201 or the like (see, FIG. 2). For example, a moving mechanism may be provided which moves the injection device 215 between the injection position and the evacuation position. For example, a transport mechanism may be provided which automatically perform loading of the wafer 10 in the container 210 and removal of the wafer 10 from the container 210. For example, a nozzle may be provided which blows dry air, nitrogen gas, or the like to dry the wafer 10. For example, a height adjustment mechanism 225 may be provided which can change the distance (working distance) from the container 210 (i.e., from the wafer 10) to the light irradiation device 220 (see FIG. 2). The height adjustment mechanism 225 adjusts the height of at least one of the light irradiation device 220 and the container 210. With the mechanism, for example, the intensity of the irradiated light can be adjusted by changing the working distance in a state where the output of the light irradiation device 220 is kept constant. For example, in a case where a mercury lamp is used as a light source of the light irradiation device 220, a decrease in the intensity of the irradiated light may be suppressed by changing the working distance when the light output decreases due to time-dependent degradation. The injection device 215 may include introduction pipes separately provided according to the liquid to be injected into the container 201. When the bubbling cleaning with hydrochloric acid hydrogen peroxide is performed as described below, it is preferable to mix hydrochloric acid and hydrogen peroxide at the time of injection into the container 201. Therefore, it is recommended that the injection device 215 is provided with an introduction pipe for hydrochloric acid and an introduction pipe for hydrogen peroxide. In order to spin dry the wafer 10, the wafer 10 may be placed on another holding jig capable of moving vertically, and rotated and dried in a state of being at a position above the bottom of the container 210. Accordingly, the drainage from the wafer 10 (especially from the rear surface of the wafer 10) can be improved.

In the above-described second embodiment, an aspect is exemplified in which the post-processing step is performed in a state where the wafer 10 is immersed in the post-processing solution 301 so that the post-processing solution 301 is collected in the container 210 from the bottom to above the surface 20 of the wafer 10, that is, in a state where the wafer 10 is submerged in the post-processing solution 301 (see, FIG. 5(*a*)). The post-processing step may be performed in other aspects.

Figure 9:
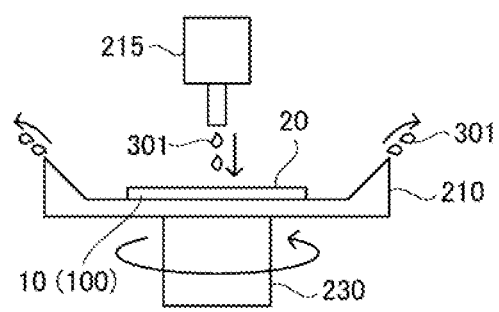
FIG. 9 is a schematic cross-sectional view illustrating another aspect of the post-processing step.

FIG. 9 is a schematic cross-sectional view illustrating another aspect of the post-processing step. In this aspect, the container 210 is rotated at high speed in a state where the post-processing solution 301 is injected to the container 210 (more specifically, in a state where the post-processing solution 301 is dropped onto the center of the wafer 10). Accordingly, the post-processing solution 301, which has contributed to the post-processing, flows from the center toward the outer peripheral side on the surface 20 of the wafer 10, so that the post-processing solution 301 is scattered toward the outer peripheral side of the container 210 and discharged. The post-processing solution 301 may be, for example, a cleaning solution such as pure water, or may be, for example, the flattening etching solution such as hydrochloric acid hydrogen peroxide.

As described above, the post-processing step does not have to be performed in a state where the wafer 10 is immersed to be submerged in the post-processing solution 301. Such a state may be regarded as a state where the wafer 10 is immersed in the post-processing solution 301 from a viewpoint that the post-processing solution 301 is in contact with the surface 20 of the wafer 10 in the aspect illustrated in FIG. 9. As in the aspect illustrated in FIG. 9, the immersion of the wafer 10 in the post-processing solution 301 and the discharge of the post-processing solution 301 by rotation may be performed simultaneously. It can be said that the post-processing step in the aspect illustrated in FIG. 9 also includes the injection-immersion step and the discharge step.

Whether in an aspect described, for example, with reference to FIG. 5(*a*) and FIG. 5(*b*) or in an aspect described, for example, with reference to FIG. 9, the post-processing step includes injecting the post-processing solution 301 into the container 210 in which the wafer 10 is held, the wafer being subjected to the PEC etching by the PEC etching step, and rotating the container 210 to scatter the post-processing solution 301 toward the outer peripheral side, thereby discharging the post-processing solution 301 from the container 210.

Methods other than those described above may be used as the flattening etching. The above-described embodiment is an embodiment in which the wet etching (not PEC etching) using an acidic or alkaline etching solution is used as the flattening etching, that is, an embodiment in which the protruding portion 122 is chemically etched. A mechanism of the flattening etching is not particularly limited as long as the protruding portion 122 is etched. Therefore, the flattening etching may be performed by etching of a mechanism other than chemical etching. By combining etchings of a plurality of mechanisms, the flattening etching may be performed more effectively.

The flattening etching may be performed, for example, by mechanically removing the protruding portion 122, for example, bubbling cleaning may be used, or, for example, scrub cleaning may be used, as the mechanical flattening etching. An example of the etching solution (cleaning solution) for the bubbling cleaning is hydrochloric acid hydrogen peroxide exemplified in the above-described embodiment. When the protruding portion 122 is etched with hydrochloric acid hydrogen peroxide, bubbles are violently generated. Therefore, the protruding portion 122 can be destroyed and removed by an impact caused by the generation of the bubbles. Hydrochloric acid hydrogen peroxide can be said to be an etching solution that chemically and mechanically etches the protruding portion 122.

<Preferable Aspect of the Disclosure>

Preferable aspects of the present disclosure will be supplementarily described hereafter.

(Supplementary Description 1)

There is provided a method for manufacturing a structure, including photoelectrochemically etching an etching object, the photoelectrochemical etching of the etching object including:

injecting an alkaline or acidic etching solution containing an oxidizing agent that receives electrons, into a rotatably held container in which an etching object at least whose surface is composed of group III nitride is held, and immersing the surface in the etching solution;

irradiating the surface of the etching object held in the container with light in a stationary state of the etching object and the etching solution; and rotating the container to scatter the etching solution toward an outer peripheral side, thereby discharging the etching solution from the container, after the surface is irradiated with the light.

(Supplementary Description 2)

There is provided the method for manufacturing a structure according to the supplementary description 1, wherein the photoelectrochemical etching of the etching object is performed a plurality of times.

(Supplementary Description 3)

There is provided the method for manufacturing a structure according to the supplementary description 1 or 2, wherein in the irradiation of the surface with light, the surface of the etching object is irradiated with the light in a state where the surface of the etching object is parallel to a surface of the etching solution.

(Supplementary Description 4)

There is provided the method for manufacturing a structure according to any one of the supplementary descriptions 1 to 3, wherein in the irradiation of the surface with light, the surface of the etching object is irradiated with the light in a state where a distance from the surface of the etching object to a surface of the etching solution is 1 mm or more and 10 mm or less.

(Supplementary Description 5)

There is provided the method for manufacturing a structure according to any one of the supplementary descriptions 1 to 4, wherein in the irradiation of the surface with light, the light is irradiated perpendicularly to the surface.

(Supplementary Description 6)

There is provided the method for manufacturing a structure according to any one of the supplementary descriptions 1 to 5, including post-processing the etching object, the post-processing of the etching object including:

injecting a post-processing solution into the container in which the etching object is held, the etching object being photoelectrochemically etched by the photoelectrochemical etching of the etching object, and maintaining a state where the etching object is immersed in the post-processing solution for a predetermined period of time; and rotating the container to scatter the post-processing solution toward the outer peripheral side, thereby discharging the post-processing solution from the container.

Supplementary Description 7)

There is provided the method for manufacturing a structure according to any one of the supplementary descriptions 1 to 5, including post-processing the etching object, the post-processing of the etching object including injecting a post-processing solution into the container in which the etching object is held, the etching object being photoelectrochemically etched by the photoelectrochemical etching of the etching object, and rotating the container to scatter the post-processing solution toward the outer peripheral side, thereby discharging the post-processing solution from the container.

(Supplementary Description 8)

There is provided the method for manufacturing a structure according to the supplementary description 6 or 7, wherein the photoelectrochemical etching of the etching object and the post-processing of the etching object are alternately repeated.

(Supplementary Description 9)

There is provided the method for manufacturing a structure according to any one of the supplementary descriptions 6 to 8, wherein in the post-processing of the etching object, the etching object is washed.

(Supplementary Description 10)

There is provided the method for manufacturing a structure according to any one of the supplementary descriptions 6 to 8, wherein in the photoelectrochemical etching of the etching object, a flat portion and a protruding portion are formed on the surface, the flat portion being newly appeared by etching, and the protruding portion being raised with respect to the flat portion and generated by being less likely to be etched than the flat portion, and in the post-processing of the etching object, the protruding portion is lowered by etching the protruding portion.

(Supplementary Description 11)

There is provided the method for manufacturing a structure according to the supplementary description 10, wherein the protruding portion is formed at a position corresponding to a dislocation of the group III nitride constituting the surface.

(Supplementary Description 12)

There is provided the method for manufacturing a structure according to the supplementary description 6, wherein in the injection of the post-processing solution into the container and maintenance of a state where the etching object is immersed in the post-processing solution for a predetermined period of time, the container is rotated (to such an extent to maintain the state where the etching object is immersed in the post-processing solution), thereby generating flow of the post-processing solution (relative to the etching object).

(Supplementary Description 13)

There is provided the method for manufacturing a structure according to the supplementary description 6, wherein in the injection of the post-processing solution into the container and maintenance of a state where the etching object is immersed in the post-processing solution for a predetermined period of time, the injection of the post-processing solution into the container is continued intermittently or continuously.

(Supplementary Description 14)

There is provided a manufacturing device for a structure, including:

a rotatably held container in which an etching object at least whose surface is composed of group III nitride is held, (and configured so that a mode of containing an etching solution and a mode of discharging the etching solution are switched depending on a state of rotation);

an injection device that injects an alkaline or acidic etching solution into the container, the alkaline or acidic etching solution containing an oxidizing agent that receives electrons;

a light irradiation device that irradiates the surface of the etching object held in the container with light;

a rotation device that rotatably holds the container;

a control device that controls the injection device, the light irradiation device, and the rotation device to perform a photoelectrochemical etching process to the etching object, the photoelectrochemical etching process to the etching object including a process for injecting the etching solution into the container in which the etching object is held, and immersing the surface in the etching solution, a process for irradiating the surface of the etching object held in the container with light in a stationary state of the etching object and the etching solution, and a process for rotating the container to scatter the etching solution toward an outer peripheral side, thereby discharging the etching solution from the container, after the surface is irradiated with the light.

(Supplementary Description 15)

There is provided the manufacturing device for a structure according to the supplementary description 14, wherein the control device controls the injection device, the light irradiation device, and the rotation device so that the photoelectrochemical etching process to the etching object is performed a plurality of times.

(Supplementary Description 16)

There is provided the manufacturing device for a structure according to the supplementary description 14 or 15, wherein the container holds the etching object so that the surface of the etching object is arranged horizontally.

(Supplementary Description 17)

There is provided the manufacturing device for a structure according to any one of the supplementary descriptions 14 to 16, wherein the control device controls the injection device to inject the etching solution into the container so that a distance from the surface of the etching object to a surface of the etching solution is 1 mm or more and 10 mm or less.

(Supplementary Description 18)

There is provided the manufacturing device for a structure according to any one of the supplementary descriptions 14 to 17, wherein the container is configured so that a distance from the surface of the etching object to a surface of the etching solution is 1 mm or more and 10 mm or less when the container is filled with the etching solution up to a height of a brim of the container.

(Supplementary Description 19)

There is provided the manufacturing device for a structure according to any one of the supplementary descriptions 14 to 18, wherein the light irradiation device is configured to irradiate the light perpendicularly to an entirety of the surface of the etching object.

(Supplementary Description 20)

There is provided the manufacturing device for a structure according to any one of the supplementary descriptions 14 to 19, wherein an inner surface of the container is composed of a surface whose upper side is inclined toward the outer peripheral side.

(Supplementary Description 21)

There is provided the manufacturing device for a structure according to any one of the supplementary descriptions 14 to 19, wherein the container is configured to change a shape of a side surface part of the container so that the etching solution is more likely to be scattered toward the outer peripheral side in a case where the process for discharging the etching solution from the container is performed, compared to a case where the process for irradiating the surface with light is performed.

(Supplementary Description 22)

There is provided the manufacturing device for a structure according to any one of the supplementary descriptions 14 to 21, wherein the control device controls the injection device and the rotation device to perform a post-processing process to the etching object, the post-processing process to the etching object including a process for injecting a post-processing solution into the container in which the etching object is held, the etching object being photoelectrochemically etched by the photoelectrochemical etching process of the etching object, and maintaining a state where the etching object is immersed in the post-processing solution for a predetermined period of time, and a process for rotating the container to scatter the post-processing solution toward the outer peripheral side, thereby discharging the post-processing solution from the container.

(Supplementary Description 23)

There is provided the manufacturing device for a structure according to any one of the supplementary descriptions 14 to 21, wherein the control device controls the injection device and the rotation device to perform a post-processing process to the etching object, the post-processing process to the etching object including injecting a post-processing solution into the container in which the etching object is held, the etching object being photoelectrochemically etched by the photoelectrochemical etching process of the etching object, and rotating the container to scatter the post-processing solution toward the outer peripheral side, thereby discharging the post-processing solution from the container.

(Supplementary Description 24)

There is provided the manufacturing device for a structure according to the supplementary description 22 or 23, wherein the control device controls the injection device, the light irradiation device, and the rotation device so that the photoelectrochemical etching process to the etching object and the post-processing process to the etching object are alternately repeated.

(Supplementary Description 25)

There is provided the manufacturing device for a structure according to the supplementary description 22, wherein in the process for injecting the post-processing solution into the container and maintaining a state where the etching object is immersed in the post-processing solution for a predetermined period of time, the control device controls the rotation device so that the container is rotated (to such an extent to maintain the state where the etching object is immersed in the post-processing solution), thereby generating flow of the post-processing solution (relative to the etching object).

(Supplementary Description 26)

There is provided the manufacturing device for a structure according to the supplementary description 22, wherein in the process for injecting the post-processing solution into the container and maintaining a state where the etching object is immersed in the post-processing solution for a predetermined period of time, the control device controls the injection device so that the injection of the post-processing solution into the container is continued intermittently or continuously.

DESCRIPTIONS OF SIGNS AND NUMERALS

10 . . . Etching object (Wafer), 20 . . . Surface (of etching object), 21 . . . Region to be etched, 30 . . . Cathode pad, 50 . . . Mask, 100 . . . Processing object, 120 . . . Surface after PEC processing, 121 . . . Flat portion, 122 . . . Protruding portion, 130 . . . Surface after flattening processing, 200 . . . Manufacturing device for a structure (Processing device), 201 . . . Etching solution, 210 . . . Container, 215 . . . Injection device, 220 . . .

Light irradiation device, 221 . . . UV Light, 230 . . . Rotation device, 240 . . . Control device, 301 . . . Post-processing solution

The invention claimed is:

1. A method for manufacturing a structure, including photoelectrochemically etching an etching object,
the photoelectrochemical etching of the etching object comprising:
injecting an alkaline or acidic etching solution containing an oxidizing agent that receives electrons, into a rotatably held container in which an etching object at least whose surface is composed of group III nitride is held, and immersing the surface in the etching solution;
irradiating the surface of the etching object held in the container with light in a stationary state of the etching object and the etching solution; and
rotating the container to scatter the etching solution toward an outer peripheral side, thereby discharging the etching solution from the container, after the surface is irradiated with the light.

2. The method for manufacturing a structure according to claim 1, wherein the photoelectrochemical etching of the etching object is performed a plurality of times.

3. The method for manufacturing a structure according to claim 2, including post-processing the etching object,
the post-processing of the etching object comprising:
injecting a post-processing solution into the container in which the etching object is held, the etching object being photoelectrochemically etched by the photoelectrochemical etching of the etching object, and maintaining a state where the etching object is immersed in the post-processing solution for a predetermined period of time; and
rotating the container to scatter the post-processing solution toward the outer peripheral side, thereby discharging the post-processing solution from the container.

4. The method for manufacturing a structure according to claim 2, including post-processing the etching object,
the post-processing of the etching object comprising injecting a post-processing solution into the container in which the etching object is held, the etching object being photoelectrochemically etched by the photoelectrochemical etching of the etching object, and rotating the container to scatter the post-processing solution toward the outer peripheral side, thereby discharging the post-processing solution from the container.

5. The method for manufacturing a structure according to claim 1, including post-processing the etching object,
the post-processing of the etching object comprising:
injecting a post-processing solution into the container in which the etching object is held, the etching object being photoelectrochemically etched by the photoelectrochemical etching of the etching object, and maintaining a state where the etching object is immersed in the post-processing solution for a predetermined period of time; and
rotating the container to scatter the post-processing solution toward the outer peripheral side, thereby discharging the post-processing solution from the container.

6. The method for manufacturing a structure according to claim 5, wherein the photoelectrochemical etching of the etching object and the post-processing of the etching object are alternately repeated.

7. The method for manufacturing a structure according to one claim 5, wherein in the post-processing of the etching object, the etching object is washed.

8. The method for manufacturing a structure according to claim 5,
wherein in the photoelectrochemical etching of the etching object, a flat portion and a protruding portion are formed on the surface, the flat portion being newly appeared by etching, and the protruding portion being raised with respect to the flat portion and generated by being less likely to be etched than the flat portion, and
in the post-processing of the etching object, the protruding portion is lowered by etching the protruding portion.

9. The method for manufacturing a structure according to claim 5,
wherein in the injection of the post-processing solution into the container and maintenance of a state where the etching object is immersed in the post-processing solution for a predetermined period of time, the container is rotated, thereby generating flow of the post-processing solution.

10. The method for manufacturing a structure according to claim 1, including post-processing the etching object,
the post-processing of the etching object comprising injecting a post-processing solution into the container in which the etching object is held, the etching object being photoelectrochemically etched by the photoelectrochemical etching of the etching object, and rotating the container to scatter the post-processing solution toward the outer peripheral side, thereby discharging the post-processing solution from the container.

11. The method for manufacturing a structure according to claim 10, wherein the photoelectrochemical etching of the etching object and the post-processing of the etching object are alternately repeated.

12. A manufacturing device for a structure, comprising:
a rotatably held container in which an etching object at least whose surface is composed of group III nitride is held;
an injection device that injects an alkaline or acidic etching solution into the container, the alkaline or acidic etching solution containing an oxidizing agent that receives electrons;
a light irradiation device that irradiates the surface of the etching object held in the container with light;
a rotation device that rotatably holds the container;
a control device that controls the injection device, the light irradiation device, and the rotation device to perform a photoelectrochemical etching process to the etching object,
the photoelectrochemical etching process to the etching object comprising
a process for injecting the etching solution into the container in which the etching object is held, and immersing the surface in the etching solution,
a process for irradiating the surface of the etching object held in the container with light in a stationary state of the etching object and the etching solution, and
a process for rotating the container to scatter the etching solution toward an outer peripheral side, thereby discharging the etching solution from the container, after the surface is irradiated with the light.

13. The manufacturing device for a structure according to claim 12, wherein the control device controls the injection device, the light irradiation device, and the rotation device so that the photoelectrochemical etching process to the etching object is performed a plurality of times.

14. The manufacturing device for a structure according to claim 12, wherein the container is configured so that a distance from the surface of the etching object to a surface of the etching solution is 1 mm or more and 10 mm or less when the container is filled with the etching solution up to a height of a brim of the container.

15. The manufacturing device for a structure according to claim 2, wherein an inner surface of the container is composed of a surface whose upper side is inclined toward the outer peripheral side.

16. The manufacturing device for a structure according to claim 12, wherein the container is configured to change a shape of a side surface part of the container so that the etching solution is more likely to be scattered toward the outer peripheral side in a case where the process for discharging the etching solution from the container is performed, compared to a case where the process for irradiating the surface with light is performed.

17. The manufacturing device for a structure according to claim 12, wherein the control device controls the injection device and the rotation device to perform a post-processing process to the etching object, the post-processing process to the etching object comprising:

a process for injecting a post-processing solution into the container in which the etching object is held, the etching object being photoelectrochemically etched by the photoelectrochemical etching process of the etching object, and maintaining a state where the etching object is immersed in the post-processing solution for a predetermined period of time, and a process for rotating the container to scatter the post-processing solution toward the outer peripheral side, thereby discharging the post-processing solution from the container.

18. The manufacturing device for a structure according to claim 17, wherein the control device controls the injection device, the light irradiation device, and the rotation device so that the photoelectrochemical etching process to the etching object and the post-processing process to the etching object are alternately repeated.

19. The manufacturing device for a structure according to claim 18, wherein in the process for injecting the post-processing solution into the container and maintaining a state where the etching object is immersed in the post-processing solution for a predetermined period of time, the control device controls the rotation device so that the container is rotated, thereby generating flow of the post-processing solution.

20. The manufacturing device for a structure according to claim 12, wherein the control device controls the injection device and the rotation device to perform a post-processing process to the etching object, the post-processing process to the etching object comprising injecting a post-processing solution into the container in which the etching object is held, the etching object being photoelectrochemically etched by the photoelectrochemical etching process of the etching object, and rotating the container to scatter the post-processing solution toward the outer peripheral side, thereby discharging the post-processing solution from the container.

* * * * *